United States Patent [19]

Toyama

[11] 4,331,479
[45] May 25, 1982

[54] PROCESS OF USING LIGHT-SENSITIVE O-QUINONE DIAZIDE MATERIAL TO MAKE ALUMINUM OXIDE NAMEPLATE

[75] Inventor: Tadao Toyama, Shizuoka, Japan

[73] Assignee: Fuji Photo Film Co., Ltd., Minami-ashigara, Japan

[21] Appl. No.: 831,577

[22] Filed: Sep. 8, 1977

Related U.S. Application Data

[63] Continuation of Ser. No. 645,047, Dec. 29, 1975, abandoned.

[30] Foreign Application Priority Data

Dec. 27, 1974 [JP] Japan .................................... 49-676

[51] Int. Cl.$^2$ .......................... G03C 5/00; G03C 1/94
[52] U.S. Cl. .................................. 430/147; 148/6.27; 204/35 R; 204/35 N; 204/38 R; 204/38 A; 428/207; 430/145; 430/149
[58] Field of Search ................ 96/36, 86 R, 35, 86 P, 96/27 R, 49, 91 D; 204/35 R, 35 N, 38 R, 38 A, 42; 148/6.27; 428/207

[56] References Cited

U.S. PATENT DOCUMENTS

| | | | |
|---|---|---|---|
| 2,020,901 | 11/1935 | Miller | 96/36 |
| 2,993,788 | 7/1961 | Straw et al. | 96/91 D |
| 2,995,443 | 8/1961 | Kempe | 96/86 R |
| 3,079,309 | 2/1963 | Wainer | 204/38 A |
| 3,280,734 | 10/1966 | Fromson | 96/86 R |
| 3,317,318 | 5/1967 | Backus et al. | 96/36 |
| 3,321,385 | 5/1967 | Fazzari | 96/86 R |
| 3,511,661 | 5/1970 | Rauher | 96/75 |
| 3,808,000 | 4/1974 | Magnotta | 96/75 |
| 3,811,894 | 5/1974 | Yonezawa et al. | 96/86 R |
| 3,833,374 | 9/1974 | Patrick | 96/86 P |

OTHER PUBLICATIONS

Botosan, R., "Stable Photographic Images in the Anodic Film of Aluminum", *Platina*, 5/1968, pp. 444–448.

*Primary Examiner*—Charles L. Bowers, Jr.
*Attorney, Agent, or Firm*—Sughrue, Mion, Zinn, Macpeak and Seas

[57] ABSTRACT

A light-sensitive nameplate material comprising an aluminum support having a porous aluminum oxide film on the surface thereof and a light-sensitive organic coating layer comprising an o-quinone diazide provided on the aluminum oxide film.

12 Claims, 4 Drawing Figures

PROCESS OF USING LIGHT-SENSITIVE O-QUINONE DIAZIDE MATERIAL TO MAKE ALUMINUM OXIDE NAMEPLATE

CROSS REFERENCE TO RELATED APPLICATIONS

This application is a continuation application of Ser. No. 645,047, filed Dec. 29, 1975, now abandoned.

BACKGROUND OF THE INVENTION

1. Field of the Invention

The present invention relates to a light-sensitive material, more particularly, the present invention is concerned with a light-sensitive nameplate material which comprises an aluminum (hereinafter, this term includes aluminum and its alloys) support having a porous aluminum oxide film on the surface thereof and a light-sensitive layer comprising an o-quinone diazide provided on the aluminum oxide film.

2. Description of the Prior Art

A method of producing a semi-permanent dye image in which a light-sensitive liquid is coated on a porous aluminum oxide film, which is brought into intimate contact with a transparent positive, printed, and developed, and then areas where the aluminum oxide film has been exposed are dyed with a dye and fine pores therein sealed is known as one method of producing aluminum oxide nameplates. These processings are described in detail in *Kinzoku Hyomen Gijyutsu Binran* (*Handbook of Metal Surface Technology*), edited by Kinzoku Hyomen Gijyutsu Kyokai (The Metal Finishing Society of Japan), published by Nikkan Kogyo Shinbun Sha, Tokyo, New Edition (Dec. 30, 1973), p. 842–852.

Hitherto, dichromic acid salt light-sensitive agents have been mainly used as light-sensitive materials for aluminum oxide nameplate materials, and, in particular, a dichromic acid-fish glue light-sensitive material has been widely used. Light-sensitive agents of this kind, however, undergo reaction even in the dark, and should be used in a day or two after coating. So far as the inventor knows, therefore, light-sensitive aluminum oxide nameplate materials are not now available on the market.

Nameplate manufacturers, therefore, have conducted all processing such as the anodic oxidation of aluminum, coating the light-sensitive material, exposure, development, dyeing, peeling of resist, and sealing of pores in their own companies. Conventional aluminum oxide nameplate materials thus require extensive time and labor to be processed. Furthermore, these materials suffer from the disadvantages that processing requires high skill, the finished articles lack uniformity, and desired articles cannot easily be produced on special order. In addition, waste liquid from development contains hexavalent chromium, which is a toxic pollutant.

To solving these problems, it has been considered to use diazonium salts and light-sensitive resins which do not undergo reaction in the dark. However, light-sensitive plates produced by coating such light-sensitive materials on aluminum oxide films are inferior in stability with time, and the inventor's experiments have revealed that such a light-sensitive plate cannot be developed more than one day after coating. The reason for this is believed to be that upon coating the light-sensitive material part of the coating material goes into the fine pores of the aluminum oxide layer, and cannot be removed with ease at the time of development.

West German Pat. (OLS) No. 2,353,499 describes a method in which in order to prevent penetration of the light-sensitive coating material into the fine pores the fine pores are sealed by heating after anodic oxidation, the light-sensitive material being coated on the fine pores so sealed.

In accordance with this method, in exposed areas upon development, and in areas where etching is conducted using a mixed liquid of potassium dichromate and sulfuric acid, fine pores are again produced, are dyed and resealed, thereby producing nameplates. While this method improves the stability with time of light-sensitive materials, it suffers from the defect that the number of processing stages increases. In addition, this method requires dichromic acid salts for etching, which are undesired from the point of environmental pollution.

SUMMARY OF THE INVENTION

One object of the present invention is to provide light-sensitive nameplate materials of excellent stability with the passage of time.

Another object of the present invention is to provide light-sensitive nameplate materials in which no dichromic acid light-sensitive agent is used.

A further object of the present invention is to provide light-sensitive nameplate materials of excellent dye receptivity.

It has now been found that these objects are attained by providing a light-sensitive organic coating layer comprising an o-quinone diazide compound on a porous aluminum oxide film.

DETAILED DESCRIPTION OF THE INVENTION

Figure 1:
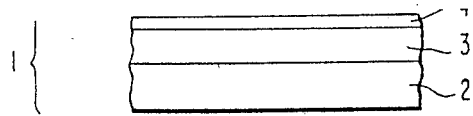
FIG. 1 is a sectional view of a light-sensitive nameplate material of the present invention.

The support used in the present invention is aluminum (which term includes alloys thereof) having a porous aluminum oxide film on at least one surface thereof.

Typical alloys of aluminum which can be utilized in the present invention include alloys thereof with, for example, silicon, iron, copper, manganese, magnesium, chromium, zinc, titanium, etc. Specific examples of various conveniently used alloys are set forth below; the present invention is not to be construed, however, as limited to such alloys.

| A A Identification | Si | | Fe | Cu | Mn | Mg | Cr | Zn | Ti | Other | Minimum Aluminium Content |
|---|---|---|---|---|---|---|---|---|---|---|---|
| 1100 | Si | + 1.0 | Fe | 0.20 | 0.05 | | | 0.10 | | 0.15 | 99.00 |
| 3003 | 0.6 | | 0.7 | 0.20 | 1.0–1.5 | | | 0.10 | | 0.15 | balance |
| 3004 | 0.30 | | 0.7 | 0.25 | 1.0–1.5 | 0.8–1.3 | | 0.25 | | 0.15 | " |
| 5052 | Si | + 0.45 | Fe | 0.10 | 0.10 | 2.2–2.8 | 0.15–0.35 | 0.10 | | 0.15 | " |
| 5056 | 0.30 | | 0.40 | 0.10 | 0.05–0.20 | 4.5–5.6 | 0.15–0.20 | 0.10 | | 0.15 | " |
| 6061 | 0.40–0.8 | | 0.7 | 0.15–0.40 | 0.15 | 0.8–1.2 | 0.04–0.35 | 0.25 | 0.15 | 0.15 | " |

The support can be produced by anodically oxidizing a plate of aluminum or an aluminum alloy (hereafter merely aluminum for purposes of brevity, unless otherwise indicated).

The above anodic oxidation is carried out by passing electricity through an aqueous solution of an inorganic acid such as phosphoric acid, chromic acid, sulfuric acid, boric acid, or the like, or an organic acid such as oxalic acid, sulfamic acid, or the like, or in an electrolyte comprising one or more non-aqueous solutions, with the aluminum plate as an anode.

Many studies have been reported on the thus obtained aluminum oxide film, e.g., in the *Journal of the Electrochemical Society*, Vol. 100, No. 9, page 411 (1953), the structure of the aluminum oxide film is shown. The aluminum oxide film is composed of structural unit cells in the form of a hexagonal prism, standing in the vertical position relative to the metal surface; pores are present in the central parts of these cells.

The size of the cells and pores, the abrasion resistance of the film, etc., vary depending upon the formation conditions, and the Table 1 shows the thickness of the cell wall and the pore size when various kinds of electrolytes are used.

TABLE 1

| Electrolyte | Dia. of Pore (Å) | Thickness of Cell Wall (Å/V)* |
|---|---|---|
| 4% Phosphoric Acid; 75° F. | 330 | 10.0 |
| 2% Oxalic Acid; 75° F. | 170 | 9.7 |
| 3% Chromic Acid; 100° F. | 240 | 10.9 |
| 15% Sulfuric Acid; 50° F. | 120 | 8.0 |

*Å/V is the abbreviation for Å/volt, which represents the thickness of the cell wall represented as a barrier layer in accordance with the procedure described in the Journal of the Electrochemical Society, Vol. 100, No.9, page 417, Table 1 (1953).

As the pore diameter increases, the pores can be dyed more easily. However, pores having too large a diameter are not desired because the light-sensitive material is liable to enter the pores. From the viewpoint of ease of handling of the liquids involved, the color tone of the oxidized film, and cost, anodic oxidation in a sulfuric acid bath is most preferred. The most preferred sulfuric acid bath is a 15 weight % aqueous solution of sulfuric acid which is used at a voltage of 30 volts and a current density of 2 A/dm² for 20 minutes.

Cell size does not particularly have any influence on the dyeing capability of a nameplate material of the present invention. However, pore size is important as this has a substantial effect on the dying ability, i.e., as briefly set forth above, if the pores size is too small dying is difficult and if the pore size is too large the light-sensitive material enters into the pores, which causes difficulties in removing the light-sensitive material at exposed areas with an alkali solution. Balancing all of the above factors, the pore size is generally from about 50 to about 350 Å, more preferably 120 to 200 Å.

An aluminum oxide film of a thickness of about 1 micron can be dyed. However, a thickness of not less than about 3 microns, preferably about 5 to about 20 microns, is necessary to obtain an effective dye density.

As one skilled in the art will appreciate, the present invention is not particularly limited with respect to the anodic oxidation conditions, but certain highly preferred areas of operation do exist to obtain a most superior nameplate material. Typically, the anodic oxidation is carried out at a temperature of from about 5° to about 40° C., more conveniently 10° to 30° C., for about 3 to about 60 minutes, more conveniently 15 to 30 minutes. Operation is most commonly at atmospheric pressure and, while nothing would prohibit the use of sub-or superatmospheric pressures, no commensurate increase in product quality is obtained by the use of such complicated systems. The voltage utilized is typically from about 5 to about 100 volts, more conveniently from 10 to 30 volts, and the current density is from about 0.2 to about 5 A/dm², more conveniently 0.5 to 3 A/dm².

A single electrolyte can be used, for example, a 15 to 20 weight % aqueous solution of sulfuric acid, a 3 to 5 weight % aqueous solution of oxalic acid, or the like, or a mixed electrolyte can be used, for example, an aqueous solution comprising about 0.5 weight % sulfuric acid, about 5 weight % oxalic acid and about 5 weight % citric acid.

The light-sensitive organic coating layer of the present invention comprises an o-quinone diazide. The o-quinone diazide contains at least one structural unit as shown below as a light-sensitive group in its molecule and is decomposable by active rays, thereby forming an alkali soluble group (see O. Süs, *Justus Liebigs Annalen der Chemie*, Vol. 556, page 65 (1944)).

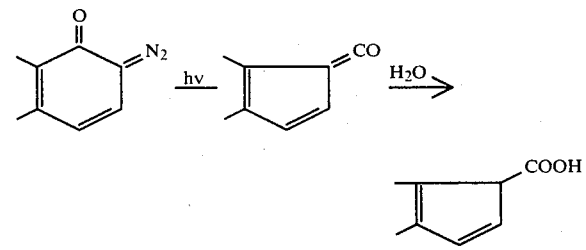

This compound has good stability with the passage of time and is widely used as a light-sensitive material for positive type light-sensitive lithographic printing materials.

These o-quinone diazide compounds are described in J. Koser, *Light-Sensitive Systems*, John Wiley & Sons, Inc., pages 339 to 352, and they can be used in the present invention. In particular, esters of o-quinone diazide sulfonic chloride with various aromatic polyhydroxy compounds and sulfonamides produced by the reaction of o-quinone diazide sulfonic chloride and aromatic amines are preferred. Examples of such materials in schematic form include:

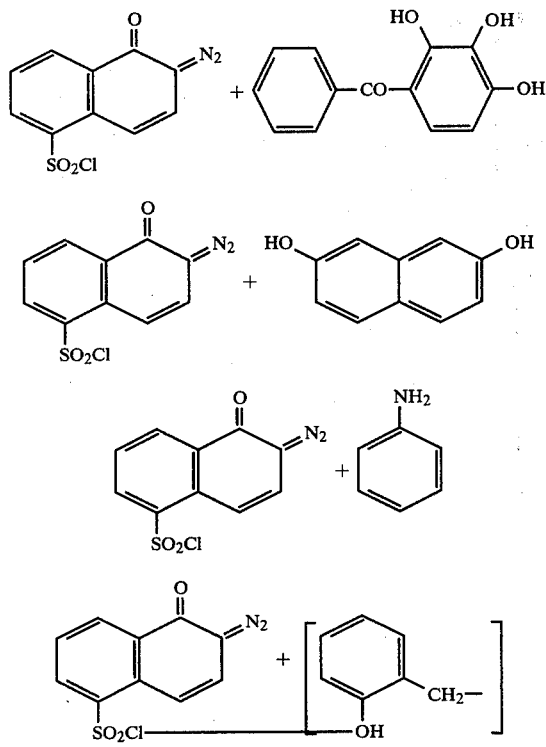

Examples of preferred o-quinone diazide sulfonic acids include benzoquinone-1,2-diazide-4-sulfonic acid, naphthoquinone-1,2-diazide-4-sulfonic acid, naphthoquinone-1,2-diazide-5-sulfonic acid, etc., and examples of useful aromatic polyhydroxy compounds are aromatic compounds which are substituted with —Cl, —OH, an alkyl group, preferably an alkyl group of 1 to 10 carbon atom, most preferably 1 to 5 carbon atom, and an aryl group, e.g., phenyl.

Suitable aromatic polyhydroxy compounds include hydroquinone, catechol, 2,2'-dihydroxybiphenyl, 4,4'-dihydroxybiphenyl, 4,4'-dihydroxydiphenyl ether, 4,4'-dihydroxy diphenylsulfide, 4,4'-dihydroxyphenylsulfone, 4,4'-dihydroxy diphenylmethane, bisphenol A, 1,8-dihydroxy naphthalene, 2,7-dihydroxynaphthalene, 1,4-dihydroxynaphthalene, 2,3-dihydroxynaphthalene, 2,2'-dihydroxy-1,1'-dinaphthylmethane, 4,4'-dihydroxybenzophenone, α,β-bis-(4-hydroxyphenyl)ethane, 1,4-dihydroxy anthraquinone, 2,7-dihydroxyfluorene, pyrogallol, methyl gallate, 2,2',4,4'-tetrahydroxybiphenyl, tetrahydroxybenzoquinone, etc.

Typical examples of sulfonates of aromatic polyhydroxy compounds and o-quinone diazide include 2,2'-dihydroxy-diphenylbis(naphthoquinone-1,2-diazide-5-sulfonate), 2,3,4-trihydroxybenzophenone-bis-(naphthoquinone-1,2-diazido-5-sulfonate), 2,7-dihydroxynaphthalene-bis(naphthoquinone-1,2-diazido-5-sulfonate), a condensation product of a phenol-formaldehyde resin and naphthoquinone-1,2-diazido-4-sulfonic acid chloride. In particular, a naphthoquinone-1,2-diazido-5-sulfonic acid ester of polyhydroxyphenyl produced by the polycondensation of acetone and pyrogallol as described in U.S. Pat. No. 3,635,709 is advantageously used.

The o-quinone diazides of the present invention are, alone or in admixture with another resin, coated on the support to produce the light-sensitive organic coating layer. As resins to be mixed with the above o-quinone diazide, alkali solution-soluble resins, e.g., a phenol resin, a cresol resin, a styrene-maleic anhydride copolymer, shellac, and the like are suitable. Most preferred are those resins which have a molecular weight of about 500 to about 100,000 preferably 1,000 to 10,000, and which are alkali solution soluble at a pH of about 12 or more.

Where o-quinone diazides are used in admixture with such resins, the mixtures preferably comprise at least about 20% by weight of the o-quinone diazides. If the o-quinone diazide content is below about 20% by weight, sufficient sensitivity cannot be obtained, and thus a sharp image cannot be obtained.

While not particularly limited, the light-sensitive layer is most preferably coated on the support in an amount of about 0.1 to about 5.0 g/m$^2$, with an amount of from about 0.5 to about 3.0 g/m$^2$ being more conveniently used for industrial scale processing to provide superior results.

Suitable amounts of various organic or inorganic additives in addition to the above described organic resins can be added, if desired to the organic coating layer. For example, to color the coating, dyes such as Crystal Violet (C.I. 42,555) and Oil Blue (C.I. 74,350), or pigments such as Phthalocyanine Blue (C.I. 74,160), or plasticizers can be added. Though not to be construed as limitative, dyes are most preferably present in an amount of about 0.1 to about 5 weight % in the lightsensitive layer and pigments are most preferably present in an amount of from about 5 to about 20 weight % in the lightsensitive layer, both based on the total weight of the lightsensitive layer.

Plasticizers are effective to provide the organic coating layer with various desired degrees flexibility. Any plasticizer can be used which is compatible with the o-quinone diazide compound(s) present and the resin(s) present. The plasticizer should be soluble in the same solvent for the o-quinone diazide compound(s) and the resin(s). The plasticizer is optional, but when used can generally be used in an amount up to about 30% by weight, based on the total weight of the lightsensitive layer. Useful plasticizers include phthalates such as dimethyl phthalate, diethyl phthalate, dibutyl phthalate, diisobutyl phthalate, dioctylphthalate, octylcapryl phthalate, dicyclohexyl phthalate, ditridecyl phthalate, butylbenzyl phthalate, diisodecyl phthalate, diallyl phthalates, and the like, glycol esters such as dimethylglycol phthalate, ethylphthalyl ethyl glycolate, methylphthalyl ethyl glycolate, butylphthalyl butyl glycolate, triethylene glycol dicaprylate, and the like, phosphates such as tricresyl phosphate, triphenyl phosphate, and the like, aliphatic dibasic acid esters such as diisobutyl adipate, dioctyl adipate, dimethyl sebacate, dibutyl sebacate, dioctyl azelate, dibutyl maleate, and the like, polyglycidyl methacrylate, triethyl citrate, glycerine triacetyl ester, butyl laurinate, and the like.

Compositions comprising one or more o-quinone diazides to form a light-sensitive organic coating layer are dissolved in suitable solvents such as ethylene glycol monoalkyl ethers and acetates thereof, e.g., ethylene glycol monomethyl ether, ethylene glycol monoethyl ether, ethylene glycol monomethyl ether acetate, ethylene glycol monoethyl ether acetate, and the like, ketones, e.g., methyl ethyl ketone, methyl isobutyl ketone, cyclohexanone, and the like, butyl acetate, dioxane, pyridine, dimethylformamide, etc., and the resulting solution is then coated on the support.

The thickness of the light-sensitive organic coating layer of the present invention is suitable, as dry weight, in the range of from about 0.1 g/m$^2$ to about 5.0 g/m$^2$, preferably 0.5 to 3.0 g/m$^2$.

Light-sensitive nameplate materials formed in accordance with the present invention are image-wise exposed by active rays (typical light sources include, e.g., a mercury lamp, a xenon lamp, a carbon arc lamp, etc., which contain radiation of a wavelength of from about 280 to about 500 nm) through a transparent negative and then developed. Development is conveniently at ambient conditions, though there is no reason why one cannot conduct development at lower or higher temperatures, if one so wishes.

Useful developers include alkali solutions heretofore known as developers for light-sensitive layers comprising o-quinone diazides. Examples thereof include aqueous solutions of inorganic alkalis, e.g., sodium hydroxide, potassium hydroxide, sodium silicate, potassium silicate, sodium tertiary phosphate, potassium tertiary phosphate, sodium carbonate, potassium carbonate, and the like, and basic solvents, e.g., mono-, di-, and triethanolamine and the like, etc. Developers which have a pH of about 11 to about 13 are, in general, most useful in the present invention. Further, it is most preferred that the developer also have the function of acting as a buffer solution at high pH values so that minimal changes in pH values occur during development. The reason for this will be apparent to one skilled in the art, i.e., it is always desirable to maintain developing ability as constant as possible so that process/product reproducibility is high.

On treating with these developers, exposed areas of the light-sensitive layer are removed, thereby exposing the support. It will be apparent to one skilled in the art that the exact method of development selected for use in the present invention is not particularly limited. For example, development is typically at atmospheric pressure and, while nothing would prohibit the use of sub- or super-atmospheric pressures, nothing is to be gained thereby. Typical development procedures comprise, for example, scrubbing the surface of the nameplate material with a soft pad, for example, cotton, impregnated with a developer, by immersing the nameplate material in a developer for about 1 minute, or, in fact, even by using an automatic developing machine, for example, a Fuji PS Processor 800 R-U (produced by Fuji Photo Film Co., Ltd.).

The thus developed nameplate material is then preferably subjected to an acid treatment after washing. Such acid treatments have been widely used as treatments after development for conventional nameplate materials in which dichromic acid salt light-sensitive agents are used, and this treatment greatly increases dyeing density. The reason for this is believed to be that this treatment slightly erodes the surface of the aluminum oxide film, thereby enlarging the openings of the fine pores, and, at the same time, removes remaining coating material at exposed areas left by development, as a result of which the dye solution is permitted to enter deeply into the interior of the fine pores.

As acids for use in this acid treatment, any acid capable of etching aluminum oxide can be used, but inorganic acids are preferred. Most particularly, a dilute solution of phosphoric acid or sulfuric acid is preferred from the point of ease of handling. The concentration of the acid is preferably about 3 to 30 wt% in aqueous solution, and desired objects can be sufficiently attained by immersion therein for several seconds to about 5 minutes, with immersion for at least about 10 seconds conveniently providing excellent results. While not overly limitative, immersion is usually effected at a temperature of about 5° C. to about 40° C., the general rule being that at higher temperatures etching progresses to a greater degree to make the pore size larger.

Furthermore, an acid processing machine of the automatic convey type connected to an automatic developing machine can be used, if desired.

Nameplate materials of the present invention are, after acid treatment, washed, dried, and dyed with dye solutions.

In this dyeing, those dyes are preferably used which are excellent in weather-resistance, heat resistance, and light-resistance. Dyes hitherto used for dyeing aluminum oxide can be suitably used.

Representative examples of these dyes are oil-soluble dyes, e.g., (Vali Fast) Black #3804 (C. I. 12195)
(Vali Fast) Orange #3206 (C. I. 18745A),
(Vali Fast) Red #3304 (C. I. 12715),
(Vali Fast) Red #3305 (C. I. 12716),
(Vali Fast) Yellow #3104 (C. I. 13900A),
Vali Fast) Yellow #3105 (C. I. 18690)

produced by Orient Industries, Ltd., water-soluble azo based mordant dyes, e.g., (Al Fast) Black SW #5801, #5802, #5803,
(Al Fast) Blue SW #5601, #5602,
(Al Fast) Brown SW #5401,
(Al Fast) Orange SW #5201, #5202,
(Al Fast) Red SW 190 5301,
(Al Fast) Yellow SW #5101, produced by Orient Chemical Industries, Ltd., and Aluminum (Golden) Orange RLW produced by Sandoz Ltd., Basle Switzerland, etc.

Such dyes are typically applied as a solution; as solvents for use in dissolving the dye(s), those solvents should be selected which do not dissolve the light-sensitive layer remaining as the resist at unexposed areas. Suitable solvents are selected from water, alcohol, esters, and hydrocarbon based solvents. Suitable examples of these solvents are methanol, ethanol, propanol, isopropanol, butanol, t-butanol, butyl acetate, benzene, toluene, xylene, hexane, petroleum ether, ligroin, etc.

Dyeing is carried out by soaking cotton or a brush in a dye solution, and coating the dye solution on the nameplate material on which the resist is formed.

After dyeing, the resist is peeled off from the nameplate material, which is then subjected to a sealing treatment. At the peeling stage, heretofore used physical peeling methods, for example, spinning a nylon-bristle roller with or without abrasives against the resist, and methods using organic solvents to dissolve the resist, for example, wiping the nameplate material with a cotton pad impregnated with an organic solvent or immersing the nameplate material in an organic solvent can be used. As one skilled in the art will appreciate, both of the above processes are typically carried out at room temperature, and can both be completed in a few seconds, with seldom more than about half a minute being required for resist removal. Further, since light-sensitive organic coating layers comprising o-quinone diazides are used in light-sensitive nameplate materials of the present invention, the resist can be easily removed by rendering the resist alkali-soluble by re-exposure, and then again developing with an alkali solution, whereby the fine support which is characteristic of the aluminum oxide coating film is exposed.

In the above re-exposure and re-development, the same light source and developer as earlier described can be used as they are.

In the pore-sealing stage, commonly used methods of pore-sealing pores of aluminum oxide films can be used. These methods are described in detail in *Kinzoku Hyomen Gijyutsu Binran (Handbook of Metal Surface Technology)*, New Ed., pages 702 to 707.

While the above described processings for the light-sensitive nameplate materials of the present invention provide nameplates excellent in abrasion resistance, chemical resistance, and weather resistance, the above processings are not intended to limit applications of these nameplate materials, that is, other successive processings can be applied to the nameplate materials, if desired, for instance one can pratice exposure, development, acid treatment, dying, sealing, peeling, followed by additional exposure, development, reexposure, dying, redevelopment, resealing, etc.

Figure 2:
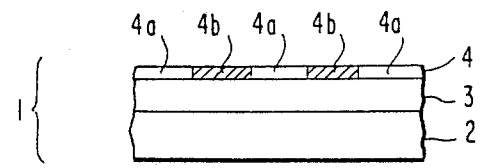
FIG. 2 is a sectional view of the light-sensitive nameplate material of FIG. 1 after exposure.
Figure 3:
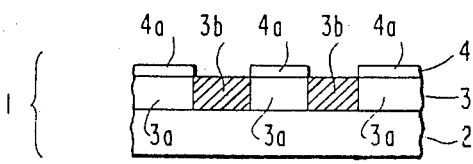
FIG. 3 is a sectional view of the exposed light-sensitive nameplate material of FIG. 2 after development, acid treatment and dyeing.
Figure 4:
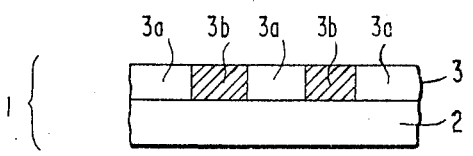
FIG. 4 is a sectional view of a finished nameplate after resist peeling and sealing of pores in the dyed nameplate material of FIG. 3.

The present invention will now be described with reference to the accompanying drawings, in which:

FIG. 1 is a sectional view of a light-sensitive nameplate 1 of the present invention, in which a light-sensitive organic coating layer 4 comprising an o-quinone diazide was provided on a porous aluminum oxide support 2;

FIG. 2 is a sectional view of the light-sensitive nameplate material 1 of FIG. 1 after exposure, in which areas 4b of the light-sensitive organic coating layer 4 were exposed, thereby becoming alkali-soluble, and can be removed by an alkaline developer, whereas unexposed areas 4a remained unchanged, and remained on the aluminum oxide film 3 even after development, to thereby act as a resist at dyeing;

FIG. 3 is a sectional view of the nameplate material 1 after development, acid treatment, and dyeing, in which areas 3b where the aluminum oxide film was exposed by development are dyed by a dye solution, whereas areas 3a protected by the unexposed areas 4a of the light-sensitive organic coating layer remaining as the resist were not dyed; and FIG. 4 is a sectional view of a finished nameplate produced by peeling off the unexposed areas 4a and pore-sealing, in which 3b indicates image areas of the dye, and 3a indicates non-image areas.

The present invention provides light-sensitive nameplate materials of excellent stability with the passage of time, and thus light-sensitive nameplate materials for use from several weeks to several months in the future can be produced at one time and stored. Therefore, desired articles can be produced on order, and, in particular, urgent orders, where time is limited, can be met.

Furthermore, it is possible to commercially supply light-sensitive nameplate materials of uniform quality which are light-sensitive (presensitized) by a continuous process from aluminum sheet pre-treatment to coating and drying. Therefore, it is unnecessary for nameplate manufacturers to conduct anodic oxidation requiring about 20 to 30 minutes in thier own companies, and, furthermore, without any need for highly skilled operators for each processing stage, whereby uniformly finished nameplates can be produced.

Moreover, since the light-sensitive nameplate materials of the present invention do not contain any dichromic acid salts, treatment of waste liquids is simple.

In addition, the light-sensitive nameplate materials of the present invention are excellent in dyeing capability, and since re-development and re-exposure can be utilized to peel off the resist, fine aluminum oxide at non-image areas free from residual film can be exposed with ease.

On the other hand, it is one of advantages that light-sensitive nameplate materials of the present invention are exposed through transparent negatives. Heretofore, an operation in which a transparent negative was produced from the original and then this transparent negative was changed into a transparent positive were required; thus, the use of the light-sensitive nameplate masterials of the present invention enables one sheet of film to be saved.

If the light-sensitive nameplate materials of the present invention are processed under a yellow lamp even though once exposed and developed, resist areas of the nameplate materials retain light-sensitivity, and thus where images are desired to be added, they can be added with ease by repeating exposure and development.

The above principle can be utilized in producing multicolored nameplates. That is, after monochromic dyeing, the material can be exposed through a transparent negative and developed, and the areas so developed dyed with another color, whereby a dichromatic nameplate can be obtained.

The present invention will be described in detail with reference to the following examples and comparison example. All % were by weight unless otherwise indicated, and all processings were at room temperature unless otherwise indicated.

EXAMPLE 1

A 0.3 mm thick aluminum plate was dipped into a 5% aqueous solution of sodium hydroxide to effect degreasing, and then washed with 30% nitric acid for 20 seconds. Anodic oxidation was then conducted by flowing electricity of a current density of 2 $A/dm^2$ in a 20% sulfuric acid bath for 15 minutes, with the aluminum plate as an anode, thereby producing a porous aluminum oxide film having a thickness of about 10 microns on the surface of the aluminum plate. The thus obtained aluminum plate was washed with water and dried. The resulting aluminum oxide film comprised cells having a size of 8.0 Å/volt and a pore size of 150 Å.

On the other hand, 4 parts by weight of an ester of polyhydroxyphenyl and naphthoquinone-1,2-diazido-5-sulfonic acid, the polyhydroxyphenyl being produced by the polycondensation of acetone and pyrogallol as described in Example 1 of U.S. Pat. No. 3,635,709, 4 parts by weight of a novolak type cresol-formaldehyde resin (molar ratio of 1:1, molecular weight of 2,000), and 0.1 part by weight of Oil Blue #603 (trade name, produced by Orient Chemical Industries, Ltd.) were dissolved in 100 parts by weight of ethylene glycol monomethyl ether. The resulting solution was coated on the aluminum oxide film and dried to a dry weight of 1.5 $g/m^2$.

The thus obtained light-sensitive nameplate material was exposed through a transparent negative for 50 seconds using a PS Light (light source: Toshiba Metal Halide Lamp MU 2000-2-OL type; 3 KW; sold by Fuji Photo Film Co., Ltd.) at a distance of 1 m, and then dipped in a 7% aqueous solution sodium silicate under a yellow lamp for 30 seconds, and then rinsed with water, whereupon exposed areas were removed and a negative of excellent sharpness was rapidly obtained.

This aluminum plate was dipped in 20% phosphoric acid for 1 minute, washed with water and dried. Onto this aluminum plate there was coated a 10% solution of (Vali Fast) Black #3804 (C.I. 12195) (trade name, produced by Orient Chemical Industries, Ltd.) in methanol as uniformly as possible with absorbent cotton. The methanol was dried and then excessive dye on the resist removed with absorbent cotton.

Subsequently, the whole surface of the aluminum plate was exposed again with the same PS Light as used above at a distance of 1 m for 50 seconds, and re-developed by dipping in a 7% aqueous solution of sodium silicate for 30 seconds, whereby the resist was completely removed. Thus, the fine aluminum oxide film was exposed, and black images of excellent resolving power appeared.

On dipping this aluminum plate in boiling water for 15 minutes to effect pore-sealing, an aluminum oxide nameplate was obtained which was excellent in abrasion resistance, chemical resistance, weather resistance and heat resistance, which had fine luster.

On the other hand, an identical fresh light-sensitive nameplate material was stored for 6 months, and after that exposed and processed in the same manner as described above. Although the dyeing density of the nameplate so obtained decreased as much as 10 percent as compared with the nameplate processed just after coating, an almost identical nameplate was obtained.

COMPARISON EXAMPLE 1

An aluminum plate, which was subjected to pretreatment and anodic oxidation in the same manner as described in Example 1 was coated with a light-sensitive solution produced by dissolving 4 parts by weight of ammonium dichromate and 15 parts by weight of fish glue in 100 parts by weight of water to a dry weight of 1.2 g/m$^2$, and dried. This material was immediately exposed through a transparent positive in the same manner as in Example 1, and subjected to water-development, acid treatment, and dyeing. Upon pore-sealing after peeling off the resist film with hot water, a fine nameplate similar to Example 1 was obtained. However, if this nameplate material was stored for one day and then exposed and processed, dark reaction had already proceeded and thus no image of satisfactory dyeing density was obtained.

EXAMPLE 2

The procedure of Example 1 was repeated except that a condensation product of a m-cresol-formaldehyde resin and naphthoquinone-(1,2)-diazido-(2)-5-sulfonyl chloride (molar ratio of 2:1, molecular weight of 2,500) was used in place of the light-sensitive organic coating layer of Example 1. After processing as in Example 1, a light-sensitive aluminum oxide nameplate material was obtained which was of excellent stability with the passage of time and of excellent dyeing capability.

EXAMPLE 3

After dyeing the aluminum plate of Example 1 with a solution of (Vali Fast) Black #3804 in methanol and removing excessive dye remaining on the resist, the aluminum plate was exposed through a transparent negative, and subjected to development and acid treatment under a yellow lamp as in Example 1, whereby the fresh aluminum oxide coating was exposed at areas where the resist had been present, thereby forming images. The image areas dyed with (Vali Fast) black were protected by coating thereon a solution of polyvinyl alcohol in water followed by drying. Thus, areas where the aluminum oxide coating was exposed were dyed with a 15 wt% solution of (Vali Fast) Yellow #3104 (produced by Orient Chemical Industries, Ltd.) in ethanol. Upon conducting processing after dyeing in the same manner as in Example 1, a fine aluminum oxide nameplate which was colored black and yellow was obtained.

While the invention has been described in detail and with reference to specific embodiments thereof, it will be apparent to one skilled in the art that various changes and modifications can be made therein without departing from the spirit and scope thereof.

What is claimed is:

1. A process for producing a nameplate material which comprises:
    (a) anodically oxidizing an aluminum support to form a porous aluminum oxide film having a pore size of from about 50 to about 250 Å and a thickness of about 5 to about 20 microns; p1 (b) applying to said porous aluminum oxide film a light-sensitive organic coating layer comprising one or more light-sensitive o-quinone diazides which are alkali-developable after exposure;
    (c) image-wise exposing said light-sensitive organic coating layer;
    (d) selectively removing, using an alkali developer solution, the exposed areas of said light-sensitive organic coating layer in correspondence to the image-wise exposure to selectively expose the aluminum oxide film;
    (e) subjecting said selectively exposed aluminum oxide film to an acid treatment with an aqueous acid solution; and
    (f) dyeing the exposed portions of the aluminum oxide film.

2. The process according to claim 1, wherein the light-sensitive organic coating layer comprises at least 20% by weight of one or more o-quinone diazides and further ones or more alkali-soluble resins.

3. The process according to claim 2, wherein the alkali-soluble resin is a phenol-formaldehyde resin or a cresol-formaldehyde resin.

4. The process according to claim 1, wherein the coating amount of the light-sensitive organic coating layer ranges from about 0.5 to about 3.0 g/m$^2$.

5. The process according to claim 1, wherein the light-sensitive organic coating layer contains not more than about 5% by weight of one or more dyes.

6. The process according to claim 1, wherein the aluminum oxide film has a pore size of from 120 to 200 Å.

7. The process according to claim 3, wherein said alkali developer solution has a pH of about 11 to about 13.

8. The process according to claim 1, wherein said aqueous acidic solution is a dilute solution of phosphoric acid or sulfuric acid.

9. The process according to claim 8, wherein said aqueous acidic solution has a concentration of about 3 to 30 wt.%.

10. The process according to claim 9, wherein said subjecting to said acid treatment is by immersing said aluminum oxide film in said aqueous acidic solution for about 10 seconds or about 5 minutes at a temperature of about 5° C. to about 40° C.

11. The process according to claim 1, wherein the product of step (f) is further processed by:
 (g) peeling off the remaining organic coating layer and then
 (h) sealing the aluminum oxide film surface.

12. The process according to claim 11, wherein the peeling off in step (g) is attained by exposing the organic coating layer to render said layer alkali-soluble and then developing said layer with an alkali developer solution.

* * * * *